United States Patent
Bai et al.

(10) Patent No.: US 10,197,817 B2
(45) Date of Patent: Feb. 5, 2019

(54) SUBSTRATE AND MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinchao Bai, Beijing (CN); Yao Liu, Beijing (CN); Huibin Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/507,122

(22) PCT Filed: Sep. 7, 2016

(86) PCT No.: PCT/CN2016/098347
§ 371 (c)(1),
(2) Date: Feb. 27, 2017

(87) PCT Pub. No.: WO2017/071412
PCT Pub. Date: May 4, 2017

(65) Prior Publication Data
US 2017/0276968 A1    Sep. 28, 2017

(30) Foreign Application Priority Data
Oct. 30, 2015 (CN) .......................... 2015 1 0725238

(51) Int. Cl.
*G02F 1/01* (2006.01)
*G02F 1/1335* (2006.01)
(Continued)

(52) U.S. Cl.
CPC .......... *G02F 1/0102* (2013.01); *G02F 1/1335* (2013.01); *G09G 3/3473* (2013.01);
(Continued)

(58) Field of Classification Search
CPC ..... G02F 1/0102; G09G 3/3473; H01L 27/32; H01L 51/5284; H05B 33/28
See application file for complete search history.

(56) References Cited

U.S. PATENT DOCUMENTS 9,841,858 B2 * 12/2017 Park ........................ G06F 3/044
2001/0048490 A1   12/2001 Lim et al.
(Continued)

FOREIGN PATENT DOCUMENTS

CN    201097055 Y    8/2008
CN    101329465 A   12/2008
(Continued)

OTHER PUBLICATIONS

The First Chinese Office Action dated Sep. 30, 2017; Appln. 201510725238.5.
(Continued)

*Primary Examiner* — Bac Au
(74) *Attorney, Agent, or Firm* — Ladas & Parry LLP

(57) ABSTRACT

A substrate and a manufacturing method thereof, and a display device are provided. The substrate comprises a base substrate (101), a metal black matrix (111) and an anti-reflection pattern (112A, 112B) for reducing optical reflectivity of the metal black matrix (111), which are arranged on the base substrate (101), and the anti-reflection pattern (112A, 112B) is arranged on a side of the metal black matrix (111) close to a light emission side of the substrate. The anti-reflection pattern (112A, 112B) reduces reflectivity of the metal black matrix (111) on outside ambient light, increases a display contrast of a display device that includes the substrate, and thus improves display quality of the pictures.

14 Claims, 3 Drawing Sheets

(51) Int. Cl.
  *G09G 3/34*    (2006.01)
  *H01L 27/32*   (2006.01)
  *H01L 51/52*   (2006.01)
  *H05B 33/28*   (2006.01)
  *H01L 27/12*   (2006.01)
  *H01L 51/00*   (2006.01)

(52) U.S. Cl.
  CPC .............. *H01L 27/12* (2013.01); *H01L 27/32* (2013.01); *H01L 51/5262* (2013.01); *H01L 51/5284* (2013.01); *H05B 33/28* (2013.01); *G09G 2310/02* (2013.01); *H01L 51/0096* (2013.01)

(56) References Cited

U.S. PATENT DOCUMENTS

| | | | | |
|---|---|---|---|---|
| 2003/0116765 | A1* | 6/2003 | Koo | H01L 27/1104 257/59 |
| 2010/0055397 | A1* | 3/2010 | Kurihara | B29C 33/42 428/141 |
| 2011/0164210 | A1* | 7/2011 | Tsuda | H01L 51/5281 349/96 |
| 2013/0043477 | A1* | 2/2013 | Jang | H01L 27/1259 257/59 |
| 2015/0362776 | A1* | 12/2015 | Jikumaru | H01L 27/124 349/12 |
| 2016/0052227 | A1* | 2/2016 | Takihara | B29C 51/02 428/141 |
| 2016/0195751 | A1 | 7/2016 | Niu | |
| 2016/0254483 | A1* | 9/2016 | Wang | H01L 51/56 257/40 |

FOREIGN PATENT DOCUMENTS

| | | |
|---|---|---|
| CN | 103353699 A | 10/2013 |
| CN | 104317097 A | 1/2015 |
| CN | 104749816 A | 7/2015 |
| CN | 104794999 A | 7/2015 |
| CN | 105093654 A | 11/2015 |
| CN | 105204223 A | 12/2015 |
| KR | 20040059647 A | 7/2004 |

OTHER PUBLICATIONS

International Search Report and Written Opinion dated Dec. 1, 2016; PCT/CN2016/098347.

* cited by examiner

SUBSTRATE AND MANUFACTURING METHOD THEREOF, AND DISPLAY DEVICE

TECHNICAL FIELD

Embodiments of the present disclosure relate to a substrate and a manufacturing method thereof, and a display device.

BACKGROUND

A display panel generally comprises an array substrate and a color filter substrate, the color filter substrate generally comprises a color filter unit and a black matrix located between adjacent color filter units, and the black matrix is used for preventing light leakage between adjacent color filter units. The black matrix for example is manufactured by using metal materials. In the case that the metal materials are used for manufacturing the black matrix, the black matrix reflects light because the metal materials have certain light reflectivity, such that a display contrast of the display panel is descend, thus affecting display quality of pictures.

SUMMARY

A substrate and a manufacturing method thereof, and a display device are provided, which are capable of solving the problems that the display contrast of the display panel is reduced due to the optical reflectivity of the metal black matrix.

According to embodiments of the disclosure, a substrate is provided. The substrate comprises a base substrate, a metal black matrix and an anti-reflection pattern for reducing optical reflectivity of the metal black matrix, which are arranged on the base substrate, and the anti-reflection pattern being arranged on a side of the metal black matrix close to a light emission side of the substrate.

For example, the anti-reflection pattern is a plurality of bumps arranged on a surface of the side of the metal black matrix close to the light emission side of the substrate.

For example, the anti-reflection pattern is a translucent anti-reflection pattern, and an orthographic projection of the metal black matrix on the base substrate falls into a region of an orthographic projection of the translucent anti-reflection pattern on the base substrate.

For example, the orthographic projection of the metal black matrix on the base substrate overlaps with the orthographic projection of the translucent anti-reflection pattern on the base substrate.

For example, the translucent anti-reflection pattern is formed by a mixture of indium tin oxide, elemental indium and elemental tin.

For example, a thickness range of the metal black matrix is 50 to 200 nm.

For example, a thickness range of the translucent anti-reflection pattern is 50 to 200 nm.

For example, the substrate further comprises: a common electrode and a common electrode line connected to the common electrode, the common electrode line is arranged on a same layer with the metal black matrix and formed by a same material with the metal black matrix.

For example, the substrate is an array substrate or a color filter substrate.

According to the embodiments of the disclosure, a display device is provided. The display device comprises the substrate as described above.

According to the embodiments of the disclosure, a manufacturing method of a substrate is provided. The method comprises: providing a base substrate; forming on the base substrate a metal black matrix and an anti-reflection pattern for reducing optical reflectivity of the metal black matrix, the anti-reflection pattern being arranged on a side of the metal black matrix close to a light emission side of the substrate.

For example, the anti-reflection pattern is a translucent anti-reflection pattern, and the metal black matrix and the translucent anti-reflection pattern are formed by a single patterning process.

For example, the translucent anti-reflection pattern is formed by a mixture of indium tin oxide, elemental indium and elemental tin.

For example, the substrate is an array substrate, and the forming the metal black matrix and the translucent anti-reflection pattern includes: depositing a metal film and an indium tin oxide film: patterning the metal film and the indium tin oxide film by a single patterning process to form the metal black matrix and the indium tin oxide pattern; treating the indium tin oxide pattern by using a hydrogen plasma, converting indium tin oxide in the indium till oxide pattern partially to elemental indium and elemental tin to form the translucent anti-reflection pattern formed by the mixture of indium tin oxide, elemental indium and elemental tin.

For example, a duration of treating the indium tin oxide pattern by using the hydrogen plasma is 0.5 to 2 minutes.

For example, the substrate is a color filter substrate, and the forming the metal black matrix and the translucent anti-reflection pattern include: depositing an indium tin oxide film; treating the indium tin oxide film by using a hydrogen plasma, converting indium tin oxide in the indium tin oxide film partially to elemental indium and elemental tin to form a translucent anti-reflection film formed by the mixture of indium tin oxide, elemental indium and elemental tin; depositing a metal film; patterning the translucent anti-reflection film and the metal film by a single patterning process to form the translucent anti-reflection pattern and the metal black matrix.

For example, a duration of treating the indium tin oxide film by using the hydrogen plasma is 0.5 to 2 minutes.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
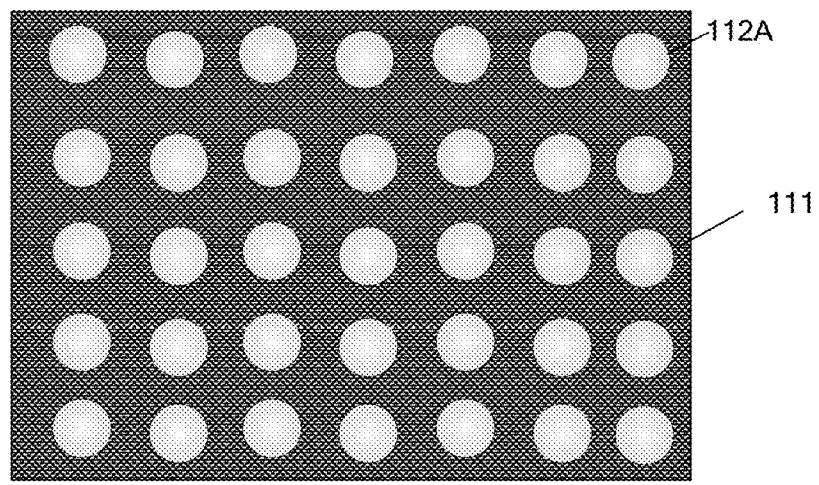
FIG. 1 is a top view of a substrate in embodiments of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of a described object is changed, the relative positional relationship may also be correspondingly changed.

Embodiments of the present disclosure provide a substrate, comprising a base substrate, a metal black matrix and an anti-reflection pattern for reducing optical reflectivity of the metal black matrix, which are arranged on the base substrate, the anti-reflection pattern is arranged on a side of the metal black matrix close to a light emission side of the substrate.

For example, the metal black matrix is manufactured by using materials such as metal, metal alloy or metal oxide, and the metal is molybdenum, chromium, aluminum, titanium, copper and the like.

The anti-reflection pattern is arranged on the side of the metal black matrix close to the light emission side of the substrate, which reduces reflectivity of the metal black matrix on outside ambient light, increases a display contrast of a display device that includes the substrate, and thus improves display quality of the pictures.

For example, the anti-reflection pattern has various structures, which will be described through examples in the following.

For example, the anti-reflection pattern is a plurality of bumps arranged on a surface of the metal black matrix; for example, the bumps are hemispherical or quasi-hemispherical; and for example, the bumps are manufactured by using a material with certain flexibility such as resin. Since the plurality of bumps are arranged on the surface of the metal black matrix, the surface of the metal black matrix is no longer a smooth surface, and thus the optical reflectivity of the metal black matrix is greatly reduced.

Figure 2:
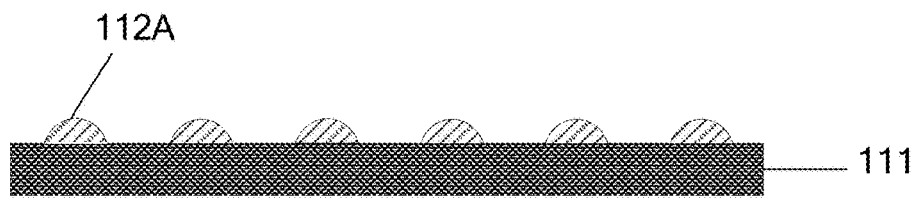
FIG. 2 is a sectional view of the substrate illustrated in FIG. 1.

For example, as illustrated by FIG. 1 and FIG. 2, the surface of the metal black matrix 111 is provided with the anti-reflection pattern 112A comprising the plurality of bumps.

For example, the anti-reflection pattern is a translucent anti-reflection pattern. For example, an orthographic projection of the metal black matrix on the base substrate completely falls into a region of an orthographic projection of the translucent anti-reflection pattern on the base substrate. That is to say, the translucent anti-reflection pattern completely covers the surface of the metal black matrix close to the light emission side of the substrate. Since the surface of the metal black matrix close to the light emission side of the substrate is covered with the translucent pattern, the optical reflectivity of the metal black matrix is greatly reduced.

Figure 3:
FIG. 3 is a sectional view of the substrate in the embodiments of the disclosure.

For example, as illustrated by FIG. 3, the surface of the metal black matrix 111 is provided with the translucent anti-reflection pattern 112B.

For example, the orthographic projection of the metal black matrix on the base substrate overlaps with the orthographic projection of the translucent anti-reflection pattern on the base substrate, i.e., the pattern of the metal black matrix is consistent with the translucent anti-reflection pattern and the translucent anti-reflection pattern does not cover regions other than the metal black matrix, so that an aperture ratio of the substrate is not affected. For example, the metal black matrix and the translucent anti-reflection pattern are formed by a single patterning process, which lessens manufacturing steps, so that the cost of production is reduced.

For example, the translucent anti-reflection pattern is formed by a mixture of indium tin oxide (ITO), elemental indium and elemental tin.

For example, the surface of the indium tin oxide is treated by using a hydrogen plasma, so that the elemental indium and the elemental tin are formed on the surface of the indium tin oxide, and thus the mixture of indium tin oxide, elemental indium and elemental tin is formed, the mixture is a translucent substance with high ambiguity. It should be noted that, in the embodiments of the present disclosure, the translucent anti-reflection pattern manufactured by using other translucent materials may also be used.

For example, a thickness range of the metal black matrix is 50 to 200 nm, such as 50 nm, 100 nm, 150 nm, and 200 nm.

For example, a thickness range of the translucent anti-reflection pattern is 20 to 50 nm, such as 20 nm, 30 nm, 40 nm, and 50 nm.

The substrate in the embodiments of the present disclosure for example further comprises a common electrode. For example, the common electrode is manufactured by using a transparent oxide conductive material like ITO; and resistance of the oxide conductive material is generally high, making it easy to result in delay of signals, and thus the result of display is affected. In order to reduce the resistance of the common electrode, the substrate in the present embodiments for example further comprises a common electrode line connected to the common electrode; for example, the common electrode line is arranged on a same layer with the metal black matrix and is formed by a same material with the metal black matrix; and for example, the common electrode line and the metal black matrix are formed by a single patterning process, so that the cost of production is reduced.

The substrate of the embodiments for example is a color filter substrate, i.e., the metal black matrix is located on the color filter substrate. In addition, for example, the substrate in the embodiments is an array substrate, i.e., the metal black matrix is located on the array substrate. The array substrate for example is a COA substrate, i.e., both the metal black matrix and a color filter unit are arranged on the array substrate; by using the COA substrate, a deviation between the array substrate and the color filter substrate during bonding the array substrate and the color filter substrate is reduced, so that an aperture ratio is increased, cost is reduced, and display quality of the product is improved.

The embodiments of the present disclosure further provide a display device, comprising the substrate in the above-mentioned embodiments.

The embodiments of the present invention further provide a manufacturing method of a substrate, comprising:

Step 11: providing a base substrate;

Step 12: forming on the base substrate a metal black matrix and an anti-reflection pattern for reducing optical reflectivity of the metal black matrix, the anti-reflection pattern being arranged on a side of the metal black matrix close to a light emission side of the substrate.

In the substrate manufactured by the method above, the anti-reflection pattern is arranged on the side of the metal black matrix close to the light emission side of the substrate, so that the reflectivity of the metal black matrix on the outside ambient light is reduced, and further, the display contrast of a display device that includes the substrate is increased to improve the display quality of the pictures.

For example, the anti-reflection pattern is a translucent anti-reflection pattern, and the metal black matrix and the translucent anti-reflection pattern are formed by a single patterning process, so that the cost of production is reduced.

For example, the translucent anti-reflection pattern is formed by a mixture of indium tin oxide, elemental indium and elemental tin.

For example, the translucent anti-reflection pattern is formed by the mixture of indium tin oxide, elemental indium and elemental tin, both the translucent anti-reflection pattern and the metal black matrix are arranged on a lower substrate (for example, an array substrate), and the forming the metal black matrix and the translucent anti-reflection pattern includes:

Step 121: depositing a metal film and an indium tin oxide film;

Step 122: patterning the metal film and the indium tin oxide film by a single patterning process to form the metal black matrix and the indium tin oxide pattern;

Step 123: treating the indium tin oxide pattern by using a hydrogen plasma, converting indium tin oxide in the indium tin oxide pattern partially to elemental indium and elemental tin to form the translucent anti-reflection pattern formed by the mixture of indium tin oxide, elemental indium and elemental tin.

For example, the translucent anti-reflection pattern is formed by the mixture of indium tin oxide, elemental indium and elemental tin, both the translucent anti-reflection pattern and the metal black matrix are arranged on an upper substrate, and the forming the metal black matrix and the translucent anti-reflection pattern includes:

Step 121': depositing an indium tin oxide film;

Step 122': treating the indium tin oxide film by using a hydrogen plasma, converting indium tin oxide in the indium tin oxide film partially to elemental indium and elemental tin to form a translucent anti-reflection film formed by the mixture of indium tin oxide, elemental indium and elemental tin;

Step 123': depositing a metal film

Step 124': patterning the translucent anti-reflection film and the metal film by a single patterning process to form the translucent anti-reflection pattern and the metal black matrix.

That is, the hydrogen plasma treatment is performed on the indium tin oxide film first, and the patterning is performed thereafter.

For example, a duration of treating the indium tin oxide pattern by using the hydrogen plasma is 0.5 to 2 minutes.

For example, the manufacturing method of the substrate in the embodiments of the present invention is described by taking an array substrate of an Advanced Super Dimension Switch (ADS) mode as an example.

Figure 4:
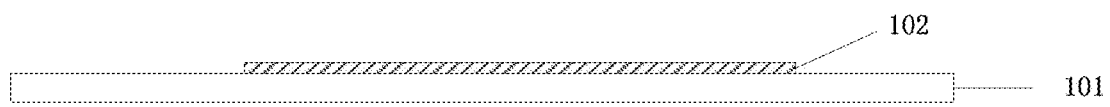
FIGS. 4-11 are schematic views of a manufacturing method of an ADS-mode array substrate in the embodiments of the disclosure.

As illustrated by FIGS. 4-11, the manufacturing method of the ADS mode array substrate comprises:

Step 41: as illustrated by FIG. 4, forming a pattern of a common electrode 102 on a base substrate 101.

For example, an ITO film is deposited on the base substrate first, and then a patterning process (e.g., exposure, development and etching) is performed on the ITO film to form the pattern of the common electrode 102.

For example, the base substrate 101 is formed by glass.

Figure 5:
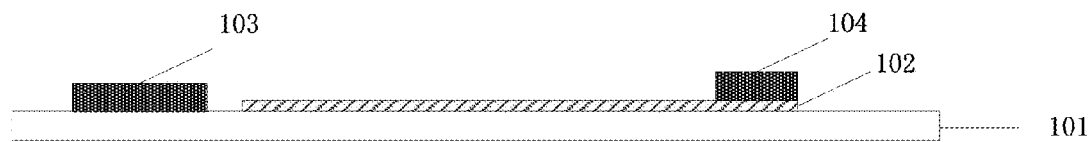

Step 42: as illustrated by FIG. 5, forming patterns of a gate electrode 103, a gate line (not shown) and a gate metal layer common electrode line 104 on the base substrate 101. For example, the gate electrode 103, the gate line and the gate metal layer common electrode line 104 are formed by a single patterning process with a same material.

Figure 6:
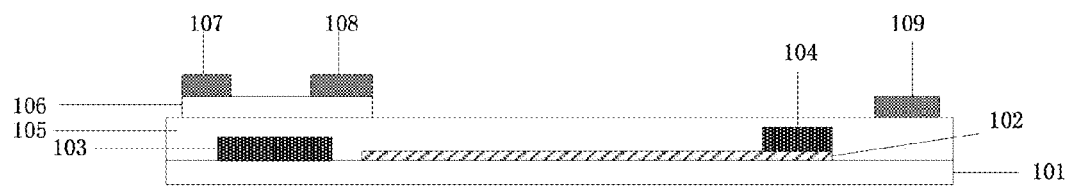

Step 43: as illustrated by FIG. 6, forming patterns of a gate insulating layer 105, an active layer 106, a source electrode 107, a drain electrode 108, a data line (not shown) and a source and drain metal layer common electrode line 109. For example, the source electrode 107, the drain electrode 108, the data line and the source and drain metal layer common electrode line 109 are formed by a single patterning process with a same material.

Figure 7:
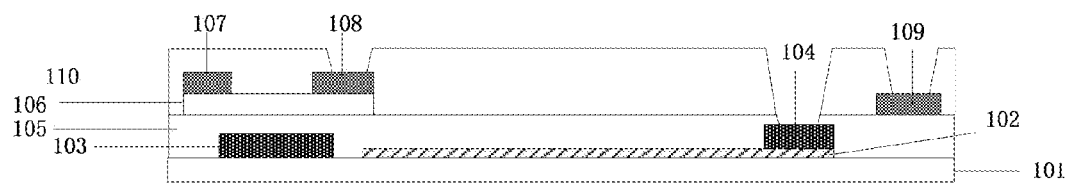

Step 44: as illustrated by FIG. 7, forming a passivation layer 110, and forming via holes above the gate metal layer common electrode line 104, the drain electrode 108 and the source drain metal layer common electrode line 109.

Figure 8:
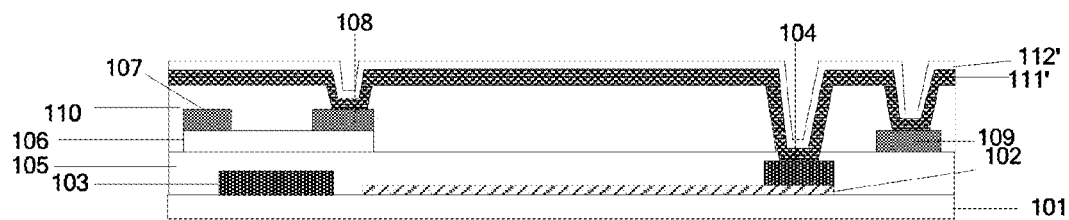
Figure 9:
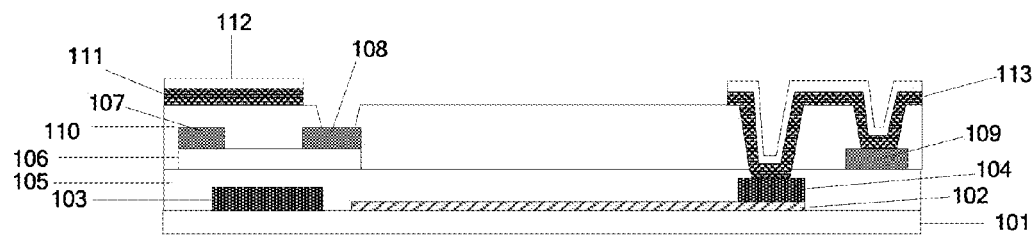

Step 45: as illustrated by FIG. 8, depositing a molybdenum film 111' and an indium tin oxide film 112' in sequence;

Step 46: as illustrated by FIG. 9, performing patterning on the molybdenum film 111' and the indium tin oxide film 112' by using a patterning process to form the metal black matrix 111, an indium tin oxide pattern 112, and a common electrode line 113 for connecting the gate metal layer common electrode line 104 and the source drain metal layer common electrode line 109. For example, the common electrode line 113 and the metal black matrix 111 are arranged on a same layer and formed by a same material.

Figure 10:
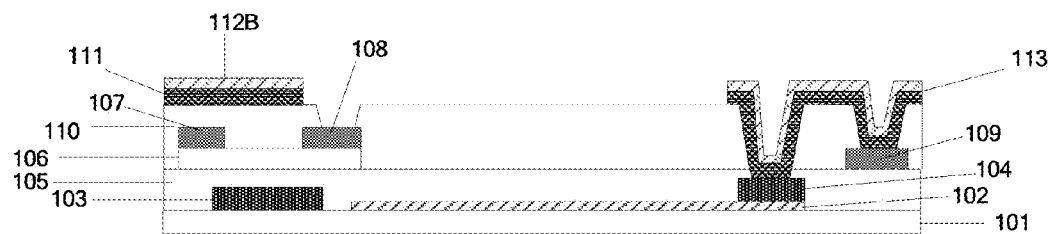

Step 47: as illustrated by FIG. 10, in a plasma enhanced chemical vapor deposition apparatus, treating the indium tin oxide pattern 112 by using a hydrogen plasma, and converting the indium tin oxide in the indium tin oxide pattern 112 partially to elemental indium and elemental tin to form the translucent anti-reflection pattern 112B formed by the mixture of indium tin oxide, elemental indium and elemental tin.

Figure 11:
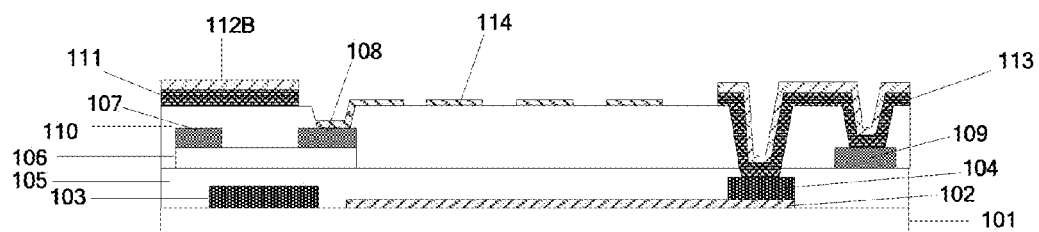

Step 48: as illustrated by FIG. 11, forming a pattern of a pixel electrode 114, the pixel electrode 114 being connected to the drain electrode 108 through the via hole.

The above embodiments describe the manufacturing method of the substrate of the present disclosure by taking the example of the ADS-mode array substrate. It should be noted that the substrate in the embodiments of the present disclosure may be a substrate with a display mode of Twisted Nematic (TN) or Vertical Alignment (VA), for which the above description taking the ADS-mode array substrate as the example may be referred to for the manufacturing method, which will not be repeated here.

The substrate and the manufacturing method thereof and the display device provided by the embodiments of the present disclosure have at least advantageous effects as follows:

The anti-reflection pattern is arranged on the side of the metal black matrix close to the light emission side of the substrate, which reduces reflectivity of the metal black matrix on the outside ambient light, increases display contrast of the display device that includes the substrate, and thus improves display quality of the pictures.

The above-mentioned embodiments are only exemplary embodiments of the disclosure, but are not used to limit the protection scope of the disclosure which is determined by the claims. For those skilled in the art, the disclosure may be varied and changed in multiple ways. Any amendment, substitution and improvement to the disclosure shall be included within the scope of the claims of the disclosure, as long as it does not go beyond the spirit or principle of the disclosure.

The present application claims priority of Chinese Patent Application No. 201510725238.5 filed on Oct. 30, 2015, the present disclosure of which is incorporated herein by reference in its entirety as part of the present application.

The invention claimed is:

1. A substrate, comprising a base substrate, a metal black matrix and an anti-reflection pattern for reducing optical reflectivity of the metal black matrix, which are arranged on the base substrate, and the anti-reflection pattern being arranged on a side of the metal black matrix close to a light emission side of the substrate, wherein the anti-reflection pattern is a translucent anti-reflection pattern, and the translucent anti-reflection pattern is formed by a mixture of indium tin oxide, elemental indium, and elemental tin.

2. The substrate according to claim 1, wherein an orthographic projection of the metal black matrix on the base substrate falls into a region of an orthographic projection of the translucent anti-reflection pattern on the base substrate.

3. The substrate according to claim 2, wherein the orthographic projection of the metal black matrix on the base substrate overlaps with the orthographic projection of the translucent anti-reflection pattern on the base substrate.

4. The substrate according to claim 2, wherein a thickness range of the translucent anti-reflection pattern is 50 to 200 nm.

5. The substrate according to claim 1, wherein a thickness range of the metal black matrix is 50 to 200 nm.

6. The substrate according to claim 1, further comprising: a common electrode and a common electrode line connected to the common electrode, the common electrode line being arranged on a same layer with the metal black matrix and formed by a same material with the metal black matrix.

7. The substrate according to claim 1, wherein the substrate is an array substrate or a color filter substrate.

8. A display device, comprising the substrate according to claim 1.

9. A manufacturing method of a substrate, comprising:
providing a base substrate;
forming on the base substrate a metal black matrix and an anti-reflection pattern for reducing optical reflectivity of the metal black matrix, the anti-reflection pattern being arranged on a side of the metal black matrix close to a light emission side of the substrate, wherein the anti-reflection pattern is a translucent anti-reflection pattern, and the translucent anti-reflection pattern is formed by a mixture of indium tin oxide, elemental indium, and elemental tin.

10. The manufacturing method of the substrate according to claim 9, wherein the metal black matrix and the translucent anti-reflection pattern are formed by a single patterning process.

11. The manufacturing method of the substrate according to claim 10, wherein the substrate is an array substrate, and the forming the metal black matrix and the translucent anti-reflection pattern includes:
depositing a metal film and an indium tin oxide film;
patterning the metal film and the indium tin oxide film by a single patterning process to form the metal black matrix and the indium tin oxide pattern;
treating the indium tin oxide pattern by using a hydrogen plasma, converting indium tin oxide in the indium tin oxide pattern partially to elemental indium and elemental tin to form the translucent anti-reflection pattern formed by the mixture of indium tin oxide, elemental indium and elemental tin.

12. The manufacturing method of the substrate according to claim 11, wherein a duration of treating the indium tin oxide pattern by using the hydrogen plasma is 0.5 to 2 minutes.

13. The manufacturing method of the substrate according to claim 10, wherein the substrate is a color filter substrate, and the forming the metal black matrix and the translucent anti-reflection pattern include:
depositing an indium tin oxide film;
treating the indium tin oxide film by using a hydrogen plasma, converting indium tin oxide in the indium tin oxide film partially to elemental indium and elemental tin to form a translucent anti-reflection film formed by the mixture of indium tin oxide, elemental indium and elemental tin;
depositing a metal film;
patterning the translucent anti-reflection film and the metal film by a single patterning process to form the translucent anti-reflection pattern and the metal black matrix.

14. The manufacturing method of the substrate according to claim 13, wherein a duration of treating the indium tin oxide film by using the hydrogen plasma is 0.5 to 2 minutes.

* * * * *